US012776471B2

(12) United States Patent
Soltz et al.

(10) Patent No.: US 12,776,471 B2
(45) Date of Patent: Oct. 27, 2026

(54) ELECTRICALLY CONDUCTIVE CERAMIC ELECTRIC FIELD BLOCKING PLATE

(71) Applicant: Applied Materials, Inc., Santa Clara, CA (US)

(72) Inventors: David Aitan Soltz, Santa Clara, CA (US); William Brian Chin, San Jose, CA (US); Andrew Alkakos, Sunnyvale, CA (US); Jonathan James Strahle, San Francisco, CA (US); Christopher Laurent Beaudry, San Jose, CA (US)

(73) Assignee: APPLIED MATERALS, INC.

( * ) Notice: Subject to any disclaimer, the term of this patent is extended or adjusted under 35 U.S.C. 154(b) by 278 days.

(21) Appl. No.: 18/668,933

(22) Filed: May 20, 2024

(65) Prior Publication Data

US 2025/0357073 A1 Nov. 20, 2025

(51) Int. Cl.
*H01J 37/16* (2006.01)
*H01J 37/34* (2006.01)

(52) U.S. Cl.
CPC ........ *H01J 37/165* (2013.01); *H01J 37/3435* (2013.01)

(58) Field of Classification Search
CPC ............................ H01J 37/165; H01J 37/3435
See application file for complete search history.

(56) References Cited

U.S. PATENT DOCUMENTS

| | | | | |
|---|---|---|---|---|
| 5,880,924 | A * | 3/1999 | Kumar | H02N 13/00 279/128 |
| 9,368,775 | B2 | 6/2016 | Visco et al. | |
| 10,622,672 | B2 | 4/2020 | Pistorino et al. | |
| 11,031,271 | B2 | 6/2021 | Muneishi | |
| 11,557,434 | B2 | 1/2023 | Kobayashi et al. | |
| 2002/0139478 | A1 | 10/2002 | Ma et al. | |
| 2008/0099148 | A1 | 5/2008 | Ryabova et al. | |
| 2021/0043429 | A1 * | 2/2021 | Tseng | H01J 37/32495 |
| 2023/0207280 | A1 | 6/2023 | Park et al. | |
| 2024/0128062 | A1 * | 4/2024 | Hollingsworth | H01J 37/32724 |

FOREIGN PATENT DOCUMENTS

WO WO 2009-115005 A1 9/2009

OTHER PUBLICATIONS

International Search Report for PCT/US2025/029939, dated Aug. 25, 2025.

* cited by examiner

*Primary Examiner* — Nicole M Ippolito
(74) *Attorney, Agent, or Firm* — Moser Taboada

(57) ABSTRACT

An electric field blocker plate which includes an electrically conductive ceramic having a bulk resistivity of less than about 5 ohm*cm. A semiconductor processing system which includes the electric field blocker plate is also disclosed.

20 Claims, 1 Drawing Sheet

ELECTRICALLY CONDUCTIVE CERAMIC ELECTRIC FIELD BLOCKING PLATE

FIELD

Embodiments of the present disclosure generally relate to a process chamber for processing semiconductor substrates. More specifically to a component of a processing chamber, more specifically to an electric field blocking plate of a plasma generator of a processing chamber.

BACKGROUND

Electric field blocking plates, also referred to as E-field blocking plates and/or ion-blocking plates, are porous structures, often comprising a plurality of holes disposed therethrough, constructed of electrically conductive material that are typically located at an exit of a plasma generator. Electric field blocking plates are dimensioned to allow plasma to flow out of the plasma generator, and to prevent undesirable backflow of reactive ions into a plasma or other substrate processing chamber. Electric field blocking plates are often utilized when a processing chamber has a plurality of plasma generators. For example, a primary and a secondary or auxiliary plasma generator. The electrical conductivity of the electric field blocking plate allows the plate to maintain an effective current to neutralize the electric field generated by the auxiliary chamber electrode. Electric field blocking plates are typically formed from aluminum or some other metal, which is covered by a thin coating to minimize degradation of the material during use. The inventors have discovered that metallic electric field blocking plates having protective coatings degrade quickly under typical use conditions and present a potential source of contamination due to such degradation.

Thus, the inventors believe that there is a need to reduce the degradation of electric field blocking plates and reduce potential sources of contamination that result from the degradation of electric field blocking plates during substrate processing.

SUMMARY

Methods and apparatus for and electric field blocking plate are provided herein. In some embodiments, an electric field blocking plate comprises an electrically conductive ceramic having a bulk resistivity of less than about 5 ohm*cm, disposable over an outlet of a plasma generator, and having a plurality of openings disposed therethrough.

In embodiments, an electric field blocking plate comprises an electrically conductive ceramic having a bulk resistivity of less than or equal to about 5 ohm*cm formed into a planar surface dimensioned to be disposed over an outlet of a plasma generator, and comprising a plurality of holes disposed therethrough, such that the plurality of holes are located over an outlet of the plasma generator.

In embodiments, a semiconductor processing system comprises a plasma source; and a semiconductor processing chamber configured to process a semiconductor substrate, wherein the plasma source is in fluid communication with the semiconductor processing chamber through a plurality of holes disposed through an electric field blocking plate located between an outlet of the plasma source and the semiconductor processing chamber, wherein the electric field blocking plate comprises an electrically conductive ceramic having a bulk resistivity of less than or equal to about 5 ohm*cm.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
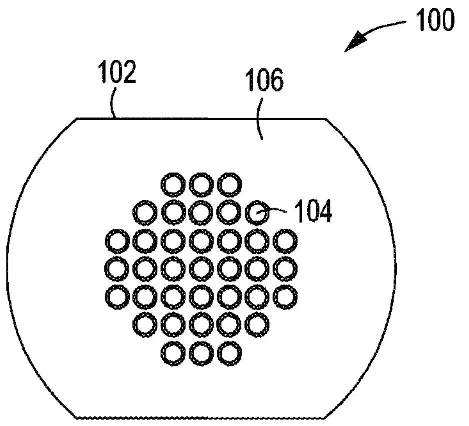
FIG. 1 depicts an overhead view of an electric field blocking plate according to an embodiment disclosed herein.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

An electric field blocking plate serves to prevent reactive ions present within a main processing chamber, e.g., a plasma chamber, from diffusing into an auxiliary plasma generator disposed on a side, top or bottom of the main processing chamber. The electric field blocking plate is electrically conductive. During operation, the electric field blocking plate is biased to block the electric field generated in the auxiliary plasma source from entering the main processing chamber. Since the electric field blocking plate must be electrically conductive to function, electric field blocking plates are typically formed from a metal such as aluminum. To protect the electric field blocking plate from degradation, and to prevent the material from which the electric field blocking plate is formed from contaminating the processing chamber, metal electric field blocking plates are coated with a surface oxide. However, the surface oxide erodes with time. The inventors have discovered that an electric field blocking plate may be formed from a conductive ceramic. The inventors have further discovered that electric field blocking plates formed from electrically conductive ceramics are much more resilient compared to metal electric field blocking plates.

Electric field blocking plates formed from an electrically conductive ceramic have also been observed to greatly extend the lifetime of the electric field blocking plate while maintaining a minimum level of conductivity necessary for the electric field blocking plate to effectively block an electric field during operation.

In embodiments, an electric field blocking plate comprises an electrically conductive ceramic having a bulk resistivity of less than about 5 ohm*cm, disposable over an outlet of a plasma generator, and having a plurality of openings disposed therethrough. In embodiments, the electric field blocking plate has an essentially planar surface through which the plurality of openings are disposed through. In embodiments, the electrically conductive ceramic comprises a doped silicon carbide. In embodiments, the electrically conductive ceramic is essentially free of phosphorus, boron, iron, gold, silver, lithium, copper, or any combination thereof.

In embodiments, the bulk resistivity of the electrically conductive ceramic is less than or equal to about 2 ohm*cm. In embodiments, the electric field blocking plate consisting essentially of, or is doped silicon carbide. In embodiments, the electric field blocking plate has a thickness of greater than or equal to about 0.5 mm.

In embodiments, an electric field blocking plate comprises an electrically conductive ceramic having a bulk resistivity of less than or equal to about 2 ohm*cm formed into a planar surface dimensioned to be disposed over an outlet of a plasma generator, and comprising a plurality of holes disposed therethrough, such that the plurality of holes are located over an outlet of the plasma generator. In embodiments, the electrically conductive ceramic comprises, consists essentially or, or consists of doped silicon carbide. In embodiments, the electrically conductive ceramic is essentially free of one or more of iron, gold, silver, lithium, copper, phosphorus, or boron. In embodiments, the electric field blocking plate has a thickness of greater than or equal to about 0.5 mm.

In embodiments, a semiconductor processing system comprises a plasma source; and a semiconductor processing chamber configured to process a semiconductor substrate, wherein the plasma source is in fluid communication with the semiconductor processing chamber through a plurality of holes disposed through an electric field blocking plate located between an outlet of the plasma source and the semiconductor processing chamber, wherein the electric field blocking plate comprises an electrically conductive ceramic having a bulk resistivity of less than or equal to about 5 ohm*cm.

In embodiments, the semiconductor processing system further comprises at least one additional plasma source in fluid communication with, and/or located within the semiconductor processing chamber. In embodiments, the electrically conductive ceramic comprises a doped silicon carbide. In embodiments, the electrically conductive ceramic is essentially free of phosphorus and/or boron. In embodiments, the electrically conductive ceramic has a bulk resistivity of less than or equal to about 2 ohm*cm.

Figure 2:
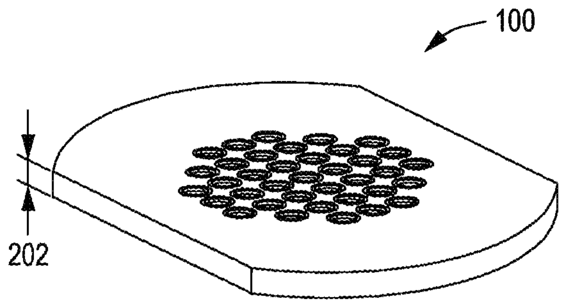
FIG. 2 depicts a perspective view of the electric field blocking plate shown in FIG. 1.

FIGS. 1 and 2 depict an electric field blocking plate 100 according to an embodiment disclosed herein. The electric field blocking plate 100 comprises, or is formed from an electrically conductive ceramic having a bulk resistivity of less than or equal to about 5 ohm*cm, or less than or equal to about 2 ohm*cm, or less than or equal to about 1.81 ohm*cm, or less than or equal to about 1.72 ohm*cm, or less than or equal to about 1.65 ohm*cm. In embodiments, the electric field blocking plate 100 is comprises or is formed from doped silicon carbide. In embodiments, the amount of doping and the dopant are selected to produce the electrically conductive ceramic having a bulk resistivity of less than or equal to about 2 ohm*cm. In embodiments, the electrically conductive ceramic is essentially free of materials which become contaminants as upon the decomposition of the electric field blocking plate 100 during substrate processing.

Figure 3:
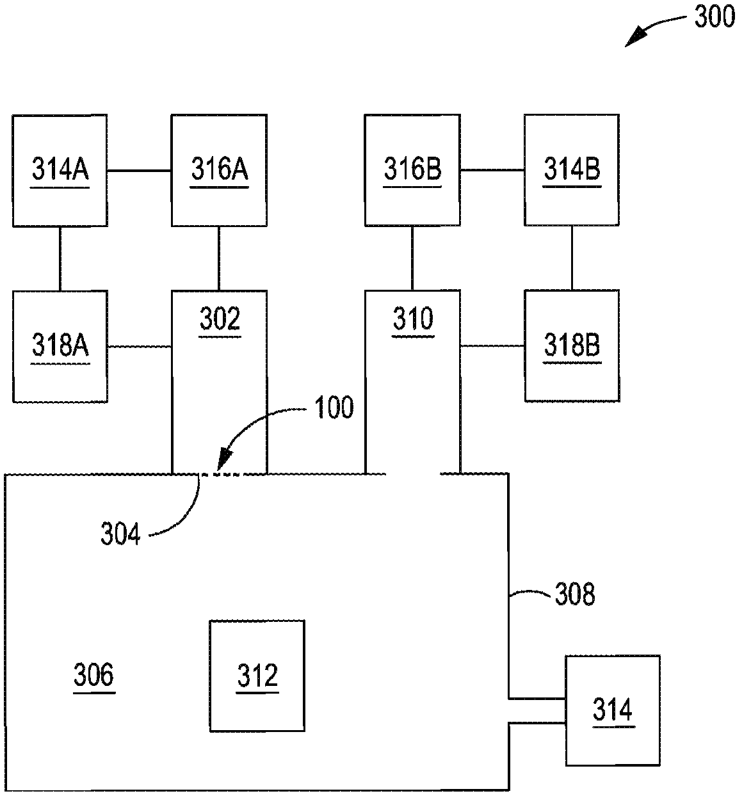
FIG. 3 is a block diagram depicting a semiconductor processing system comprising an electric field blocking plate according to embodiments disclosed herein.

In embodiments, the electric field blocking plate has a shape 102 and is dimensioned to be disposed over an outlet of a plasma generator (see FIG. 3). The electric field blocking plate 100 comprises a plurality of openings 104 disposed therethrough. In embodiments, the electric field blocking plate 100 has an essentially planar surface 106 through which the plurality of openings 104 are disposed through.

In embodiments, the essentially planar surface of the electric field blocking plate has an average roughness $R_a$ of less than or equal to about 5 μm, or of less than or equal to about 4.3 μm, or of less than or equal to about 3.2 μm.

In embodiments, the electric field blocking plate has a thermal conductivity of greater than or equal to about 100 W/mK, or greater than or equal to about 110 W/mK, or greater than or equal to about 125 W/mK.

In embodiments, the electric field blocking plate has a flexural strength of greater than or equal to about 95 MPa, or greater than or equal to about 100 MPa, or greater than or equal to about 110 MPa.

In embodiments, the electrically conductive ceramic comprises a doped silicon carbide. While the electrically conductive ceramic has shown improved degradation relative to oxide coated metal materials, degradation is not entirely eliminated. Accordingly, in embodiments, the electrically conductive ceramic is essentially free of materials that present possible contamination issues while processing a substrate due to degradation of the electrically conductive ceramic. In embodiments, the electrically conductive ceramic is doped silicon carbide, which upon decomposition does not degrade to produce contaminants which persist in a processing chamber. In embodiments, the electrically conductive ceramic is essentially free of materials which may provide a source of contaminants during the processing of a substrate. These materials may include iron, gold, silver, lithium, copper, boron, phosphorus, or any combination thereof.

As shown in FIG. 2, in embodiments, the electric field blocking plate 100 has a thickness 202 of greater than or equal to about 0.5 mm, or greater than or equal to about 1 mm and less than or equal to about 10 mm. In embodiments, the electric field blocking plate 100 is machined from an electrically conductive ceramic.

FIG. 3 is a block diagram showing a semiconductor processing chamber system 300 comprising a processing chamber 308 equipped with a plasma generator 302 equipped with the electric field blocking plate 100 according to embodiments disclosed herein, disposed between an exit 304 of the plasma generator 302 and an interior volume 306 of the processing chamber 308. In the embodiment shown in FIG. 3, the semiconductor processing chamber system 300 comprises another plasma source 310 in fluid communication with the interior volume 306 of the processing chamber 308.

Each of the plasma generators 302 and 310 of the semiconductor processing chamber system 300 further include a controller (314A and 314B), a gas source (318A and 318B), and a power source (316A and 316B). The semiconductor processing chamber system 300 further includes a vacuum or pressure system 314 necessary for processing of a substrate disposed on a substrate support 312.

Accordingly, making the electric field blocking plate from an electrically conductive ceramic greatly extends the lifetime of the component reducing the need for frequent shutdown to effect preventive maintenance of the chamber while maintaining the minimum level of conductivity necessary for the electric field blocking plate to effectively block electric fields during operation. The electric field blocking plate functions to effectively shield the electric field generated in a plasma source from entering into the larger processing chamber, while also having improved resilience against attack by reactive ions produced during typical substrate processing which greatly extends the operational lifetime of the component and reduces possible contamination.

While the foregoing is directed to embodiments of the present disclosure, other and further embodiments of the disclosure may be devised without departing from the basic scope thereof.

The invention claimed is:

1. An electric field blocker plate, comprising:

an electrically conductive ceramic having a bulk resistivity of less than about 5 ohm*cm, disposable over an outlet of a plasma generator, and having a plurality of openings disposed therethrough.

2. The electric field blocker plate of claim 1, having an essentially planar surface through which the plurality of openings are disposed through.

3. The electric field blocker plate of claim 1, wherein the electrically conductive ceramic comprises a doped silicon carbide.

4. The electric field blocker plate of claim 1, wherein the electrically conductive ceramic is essentially free of one or more of iron, gold, silver, lithium, copper, phosphorus, or boron.

5. The electric field blocker plate of claim 1, wherein the bulk resistivity is less than or equal to about 2.0 ohm*cm.

6. The electric field blocker plate of claim 1, consisting essentially of doped silicon carbide.

7. The electric field blocker plate of claim 1, having a thickness of greater than or equal to about 0.5 mm.

8. The electric field blocker plate of claim 1, having an average surface roughness $R_a$ of less than or equal to about 5 μm.

9. The electric field blocker plate of claim 1, having a thermal conductivity of greater than or equal to about 100 W/mK.

10. The electric field blocker plate of claim 1, having a flexural strength of greater than or equal to about 95 MPa.

11. An electric field blocker plate, comprising:

an electrically conductive ceramic having a bulk resistivity of less than or equal to about 2 ohm*cm formed into a planar surface dimensioned to be disposed over an outlet of a plasma generator, and comprising a plurality of holes disposed therethrough, such that the plurality of holes are located over an outlet of the plasma generator.

12. The electric field blocker plate of claim 11, wherein the electrically conductive ceramic comprises doped silicon carbide.

13. The electric field blocker plate of claim 12, wherein the electrically conductive ceramic is essentially free of one or more of iron, gold, silver, lithium, copper, phosphorus, or boron.

14. The electric field blocker plate of claim 11, consisting essentially of doped silicon carbide.

15. The electric field blocker plate of claim 11, having a thickness of greater than or equal to about 0.5 mm.

16. A semiconductor processing system, comprising:

a plasma source; and a semiconductor processing chamber configured to process a semiconductor substrate, wherein the plasma source is in fluid communication with the semiconductor processing chamber through a plurality of holes disposed through an electric field blocking plate located between an outlet of the plasma source and the semiconductor processing chamber, wherein the electric field blocking plate comprises an electrically conductive ceramic having a bulk resistivity of less than or equal to about 5 ohm*cm.

17. The semiconductor processing system of claim 16, further comprising at least one additional plasma source in fluid communication with, and/or located within the semiconductor processing chamber.

18. The semiconductor processing system of claim 16, wherein the electrically conductive ceramic comprises a doped silicon carbide.

19. The semiconductor processing system of claim 16, wherein the electrically conductive ceramic is essentially free of one or more of iron, gold, silver, lithium, copper, phosphorus, or boron.

20. The semiconductor processing system of claim 16, wherein the electrically conductive ceramic has a bulk resistivity of less than or equal to about 2 ohm*cm.

* * * * *